United States Patent [19]

Morin et al.

[11] Patent Number: 5,126,680
[45] Date of Patent: Jun. 30, 1992

[54] PROBE FOR USE IN NON-DESTRUCTIVE MEASURING OF ELECTRICAL RESISTANCE OF A HIGH CURRENT ELECTRICAL CONNECTION

[75] Inventors: Francois Morin, Longueuil; Michael Parker, Ste-Julie, both of Canada

[73] Assignee: Hydro-Quebec, Montreal, Canada

[21] Appl. No.: 571,262

[22] Filed: Aug. 23, 1990

[51] Int. Cl.$^5$ .......................................... G01R 27/14
[52] U.S. Cl. ...................... 324/724; 324/715
[58] Field of Search ............... 324/149, 713, 715, 724, 324/72.5

[56] References Cited

U.S. PATENT DOCUMENTS

| 2,208,023 | 7/1940 | Ellis | 324/724 |
| 4,179,652 | 12/1979 | Davis | 324/715 |

FOREIGN PATENT DOCUMENTS 1436048  11/1988  U.S.S.R. .............................. 324/715

OTHER PUBLICATIONS

"Multiple Electrode Probe Assemblies and Nondestructive Testing of High Ampacity Joints," Francois Morin et al., Aug. 1990.
Technologie Affaires Internationales Institut de Recherche D'Hydro-Quebec, report of Activities, Dec. 1989.

*Primary Examiner*—Jack B. Harvey
*Assistant Examiner*—Maura K. Regan
*Attorney, Agent, or Firm*—Foley & Lardner

[57] ABSTRACT

A probe for use in non-destructive measuring of electrical resistance of a high current electrical connection between two high current electrical conductors, each of the conductors having a longitudinal exterior surface, the probe comprising: an articulated body being articulated about a longitudinal axis; a plurality of electrodes provided on an interior portion of the articulated body for engaging about the longitudinal exterior surface; connecting means for releaseably connecting the articulating body around the longitudinal exterior surface, the connecting means including resilient means cooperating with the plurality of electrodes for causing the electrodes to resiliently engage the surface, the electrodes being located on the probe body to be arranged substantially evenly around and on the longitudinal exterior surface of the corresponding conductor in a plane substantially perpendicular to a current flow in the conductor; and resistors connected in series with each electrode, each of the resistors having substantially an equal resistance substantially greater than a contact resistance between the corresponding electrode and the corresponding conductor, the resistors being connected to at least one common terminal for connection to a high sensitivity low resistance ohm-meter. The probe makes the measuring easier and more accurate by assuring a good current distribution in the conductors.

24 Claims, 6 Drawing Sheets

PROBE FOR USE IN NON-DESTRUCTIVE MEASURING OF ELECTRICAL RESISTANCE OF A HIGH CURRENT ELECTRICAL CONNECTION

FIELD OF THE INVENTION

The present invention relates to a probe for use in non-destructive measuring or testing of the resistance of high current electrical connections between high current electrical conductors.

BACKGROUND OF THE INVENTION

High-ampacity electrical joints are commonly used in energy generation and distribution systems. Currents usually range from several hundred to several thousand amperes, and the resistance of these joints varies between a few micro-ohms and several tens of micro-ohms. Owing to the high power levels involved, sporadic failure of these connections causes substantial damage to the equipment as well as reducing the overall availability of electrical energy. There are only a few preventive, non-destructive methods suitable for testing these joints. Conventional thermography, for instance, should lend itself to the detection of defective joints on the basis of observations of hot spots. However, tests generally must be performed at or close to the full, rated current expected to flow through the joint. Moreover, results are greatly influenced by factors such as the actual emissivity factor of the joint surface and its orientation with respect to the camera. Finally, electrically insulated joints may lead to erratic conclusions on the actual overheating of the joints because of ill-defined heat-transfer conditions. It is therefore not surprising that thermography inspection is not always successful in relating the recorded temperatures to the actual state of deterioration of high-ampacity joints.

The method of resistance testing of high-ampacity electrical joints is described on pages 1078 to 1082 of the September 1989 issue of "Materials Evaluation". According to the known method called the four-point method, a high-ampacity test current is run between opposite ends of a joint to be tested, and the minute potential caused by the small resistance of the joint is measured using a microvoltmeter.

The known method is effective and is considerably accurate using a high sensitivity ohmmeter. However, there is the need for effective probe assemblies for facilitating efficient contact between the conductor material of the joint to be tested and the high sensitivity ohmmeter.

SUMMARY OF THE INVENTION

It is an object of the present invention to provide a probe for use in non-destructive measuring of electrical resistance of a high current electrical connection between two high current electrical conductors, the probe being able to make easy and efficient contact with a surface of the conductor to provide consistent and accurate electrical resistance measurements. In certain high-ampacity electrical systems, the number of electrical joints is many, and therefore it is an object of the invention to provide a probe which is quick and easy to use.

It is also an object of the present invention to provide a probe for use in non-destructive resistance measuring of high current electrical connections, the probe being able to establish a current flow distribution in a conductor near or at a high current electrical connection such that a close approximation of actual operational current flow conditions can be created and a close approximation of actual operational connection resistance can be observed and measured.

According to the invention, there is provided a probe for use in non-destructive measuring of electrical resistance of a high current electrical connection between two high current electrical conductors, each of the conductors having a longitudinal exterior surface, the probe comprising: an articulated body being articulated about a longitudinal axis; a plurality of electrodes provided on an interior portion of the articulated body for engaging about the longitudinal exterior surface; connecting means for releasably connecting the articulated body around the longitudinal exterior surface, the connecting means including resilient means cooperating with the plurality of electrodes for causing the electrodes to resiliently engage the surface, the electrodes being located on the probe body to be arranged substantially evenly around and on the longitudinal exterior surface of the corresponding conductor in a plane substantially perpendicular to a current flow in the conductor; and resistors connected in series with each electrode, each of the resistors having substantially an equal resistance substantially greater than a contact resistance between the corresponding electrode and the corresponding conductor.

The articulated body can be configured to match the shape of the conductors to be tested. In a first embodiment of the invention, the articulated body preferably comprises two substantially rectangular members, each rectangular member having an interior side facing a corresponding interior side, and two longitudinal and two lateral edges, the two rectangular members being connected together at one of the two longitudinal edges so that the two interior sides can close and open while remaining parallel, whereby the rectangular members can open and close on the longitudinal exterior surface of a conductor having two major substantially flat sides. In the first embodiment, the conductor can be of the Roebel type.

In a second embodiment, the articulated body preferably comprises a plurality of annular segment elements flexibly interconnected, whereby the annular segment elements can open and close on a substantially cylindrical multi-strand conductor cable, each annular segment element comprising at least one electrode. In the second embodiment, the probe can be used on multi-strand power transmission cables to test joints along a transmission line.

According to a third embodiment, the articulated body preferably comprises two substantially semi-annular members pivotally connected together at one end of the semi-annular members, whereby the semi-annular members can open and close on the corresponding conductor, and the electrodes are provided on an interior portion of both semi-annular members and are directed radially inward. According to the third embodiment, the probe can be preferably used for a solid sleeve of a high current electrical conductor joint. In the case of a hexagonal cross-section joint sleeve used in transmission line connections, the probe preferably comprises two semi-annular members each having an interior surface made of three surface segments forming angles of 120° with respect to one another. Preferably, an electrode is resiliently mounted in a center part of each surface segment.

DETAILED DESCRIPTION OF THE PREFERRED EMBODIMENTS

The probe assemblies according to the preferred embodiments can be used either for injecting a test current into a high-ampacity conductor of a joint to be tested or for connecting to the conductor for measuring a potential across an electrical connection.

Figure 1:
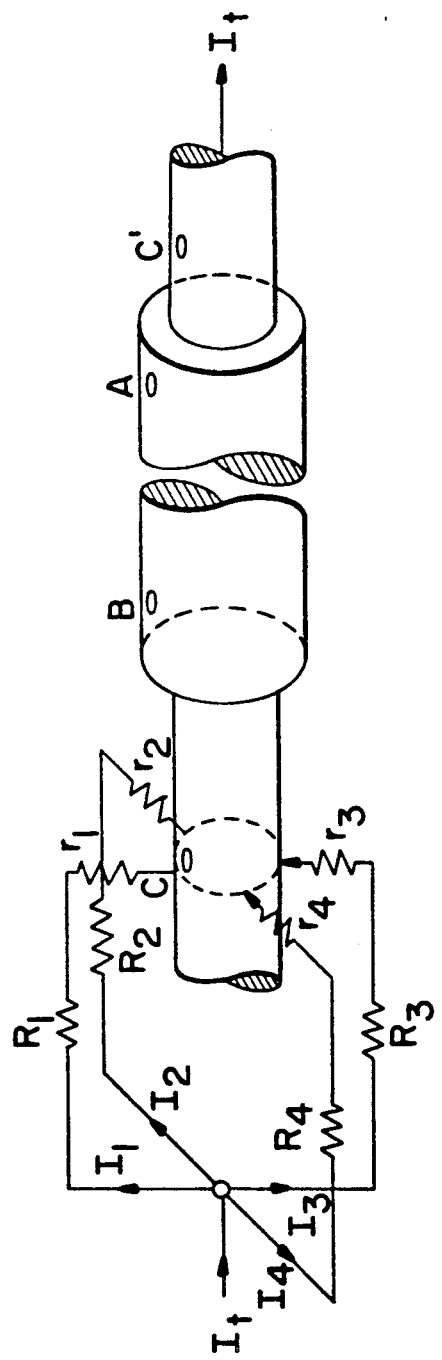
FIG. 1 is a schematic representation of a multiple electrode configuration for the non-destructive testing of high-ampacity conductor joints.

Generally, as shown in FIG. 1, the test current I is injected at contact points according to a perpendicular plan C by dividing the test current I into I1, to I4 to flow through a number of contact electrodes which may contact an outer surface of the conductor at evenly spaced intervals around the surface of the conductor in a plane substantially perpendicular to a current flow. As is shown in FIG. 1, R1 through R4 are connected in series with each electrode and r1 through r4 represent the contact resistances of the four electrodes. Resistances, R1 through R4, are chosen to be substantially larger than the contact resistances to ensure an even distribution of current into the conductor. The resistances R may be of the order of 100 times larger than the nominal contact resistance. Current injected into the conductor as shown in FIG. 1 will assume, to a very close approximation, a normal distribution of current flow within the conductor cable. According to the known four-point method, the potential across contact points according to perpendicular plans A and B is measured while briefly flowing a very high current across contact points according to perpendicular plans C and C'. The current cycle is brief enough such that resistance heating is negligeable. FIG. 1 shows the electrical schematic drawing for a four-electrode probe connected at contact points according to plan C. According to the known four-point method, the positions of contact points according to plans C, B, A and C' may be varied in accordance with the part of the electrical joint whose resistance is to be measured.

Figure 2:
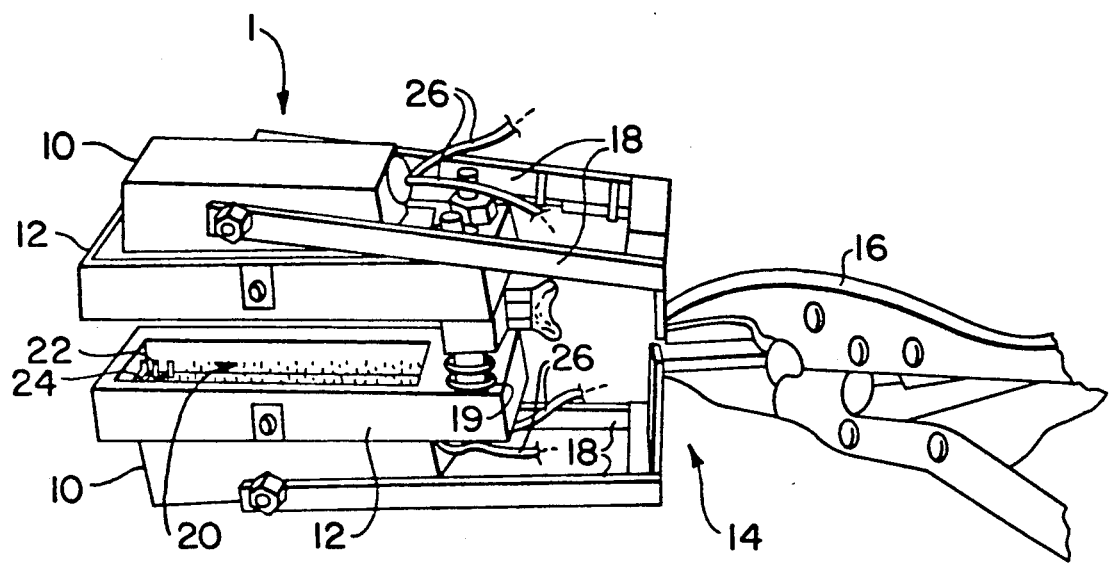
FIG. 2 is a perspective view of the probe assembly according to the first embodiment.

In the first preferred embodiment, as shown in FIG. 2, the probe 1 comprises a large number of electrodes 20 arranged in two rows, namely a current row 22 and a potential row 24. Each row 22 and 24 has the electrodes 20 connected to a wire lead 26. The probe 1 has two rectangular members 10 pivotably connected via arms 18 to a clamping mechanism 16. Two rectangular guide frames 12 surround the electrodes 20 provided on the rectangular members 10 so that as the probe 1 is placed over an electrical conductor having two flat longitudinal sides, the electrodes 20 are protected against making a lateral brushing action against the component conductor strands of a high-ampacity conductor. Two cylindrical shafts 19 pass through seats in guide frames 12 to maintain frames 12 parallel while moving together and apart. The arms 18, shafts 19 and the clamp mechanism 16 combine to form connecting means 14 for connecting the two rectangular members 10 to a conductor (not shown).

Figure 3:
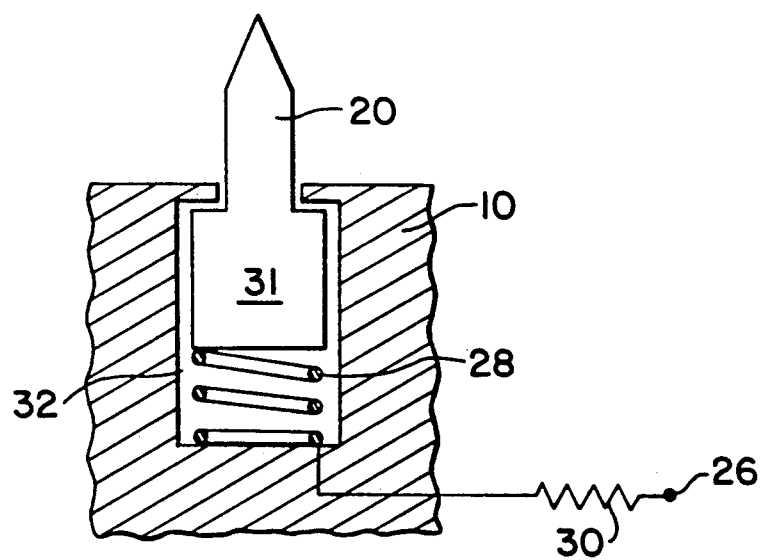
FIG. 3 is a cross-sectional view about a longitudinal axis of an electrode of the first embodiment.

As shown in FIG. 3, each electrode 20 has its own spring 28 and is resiliently moveable along a longitudinal axis of the electrode 20 having a base part 31 which is moveable within a cylindrical cavity 32 within the rectangular member 10. As shown in FIG. 3, the electrode 20 is electrically connected via spring 28 made of an electrically conducting material to a resistor 30 which then connects to wire lead 26.

Figure 10:
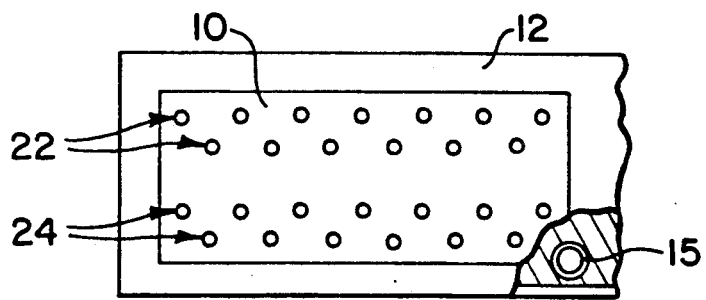
FIG. 10 is a plan view of the interior side of the probe body according to the first embodiment.

As shown in FIG. 10, the electrodes of the current row 22 are arranged in a close packed or stagered configuration such that the current row 22 is divided into two series placed immediately adjacent one another such that the centers of the electrodes 20 of one series lie between corresponding centers of the electrodes 20 of the adjacent series. In this way, the offset of the electrodes in the longitudinal direction of the conductor is minimized while increasing the number of electrodes 20 making contact with the conductor surface. The guide frames 12 are connected to the rectangular members 10 in a resilient fashion by springs 15, provided in each corner as shown in FIG. 10, such that when the clamp mechanism causes the rectangular members to close on a rectangular cross-section conductor, the electrodes 20 on both rectangular members 10 are pushed inwardly toward the conductor surface as the guide frames 12 are resiliently pushed back toward the rectangular members 10. Frames 12 and springs 15 combine to form guard means for electrodes 20.

The configuration of the current row 22 is identical to that of the potential row 24 and the probe 1 of the first embodiment is to be arranged on a conductor such that the high-ampacity test current flows from the current row 22 in the direction of the potential row 24. With the member of electrodes 20 on rows 22 and 24 being almost equal to the member strands on the sides of a Roebel conductor, a close approximation of actual current flow in the conductor is achieved. To facilitate illustration, the density of electrodes 20 of rows 22 and 24 is shown as being less than the usual high density of wires on a Roebel bar.

Figure 4:
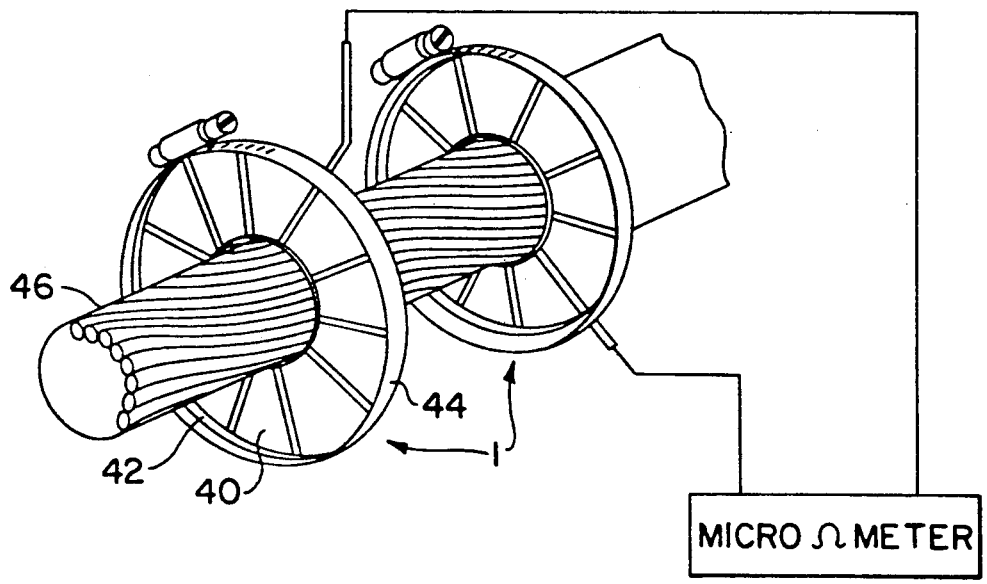
FIG. 4 is a perspective view of the probe according to the second embodiment.
Figure 6:
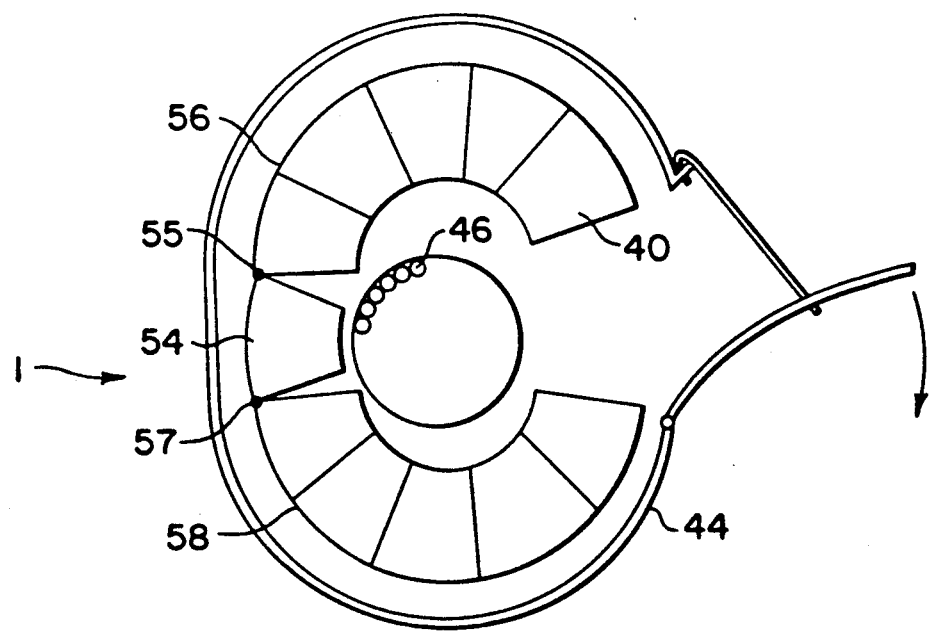
FIG. 6 appearing with FIG. 4 is an axial view of the probe according to the second embodiment showing the hinged structure.
Figure 5:
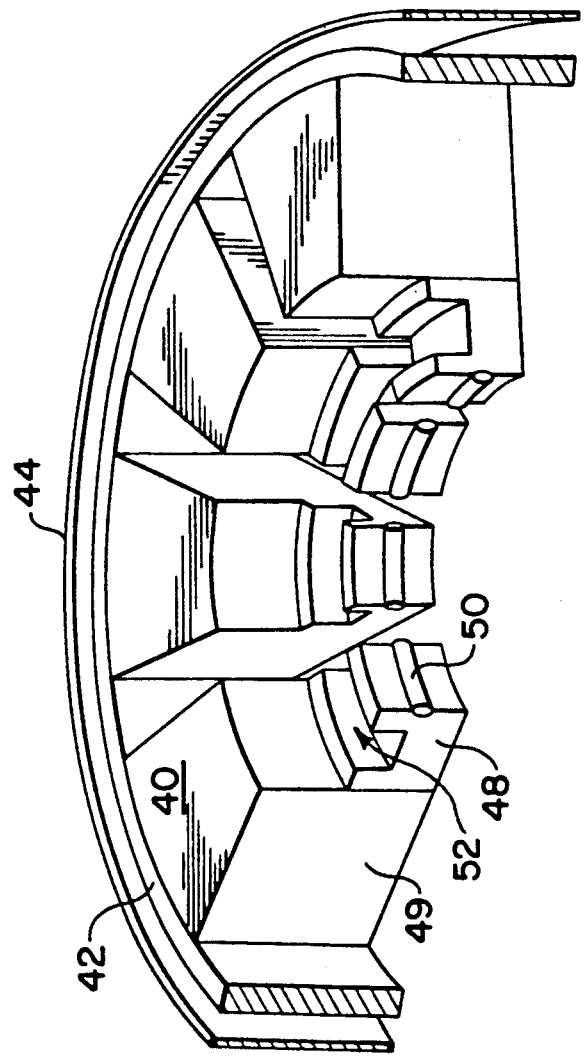
FIG. 5 is an expanded detailed view of a part of the probe of the second embodiment showing details of the segment elements.

In the second preferred embodiment as shown in FIGS. 4, 5 and 6, the probe 1 has an articulated body made up of a plurality of annular segment elements 40 interconnected by a circular band 42. A tension strap 44 closes the probe 1 on the stranded cable 46 such that each segment 40 makes firm contact with the strands of the cable 46. By virtue of the tension strap 44, each segment 40 has a certain degree of freedom to make independent resilient contact with the strands of cable 46. The segments 40 are shown in greater detail in FIG. 5, wherein it can be seen that the segments 40 comprise an insulating part 49 with a conducting part 48. The conducting part 48 has a channel 52 for accommodating the electrical wires. On the inside circumference of the segments 40, there is provided a tungsten wire segment 50 whose side makes contact with the strands of cable 46. Preferably, each of the wire segments 50 makes contact with two strands of cable. Tungsten is chosen as the material for the wire segments 50 for its qualities as a good electrical conductor while not being easily deformable under pressure. As is shown in FIG. 5, each of the segments 40 are mechanically interconnected at an outer circumference by the flexible arcuate band 42 on the outer circumference of which the tension strap 44 is to be fastened. Each of the segments is also electrically connected to a common wire lead through a current averaging resistor.

As best shown in FIG. 6, the probe 1 according to the second preferred embodiment comprises a middle portion 54 which is hinged by hinges 55 and 57 to two arcuate bands 56, 58. The probe body is configured with three portions 54, 56 and 58 as shown in FIG. 6 to facilitate opening and closing on cable 46. To secure the probe 1 to the cable 46 the probe is opened, placed over the cable 46 and then closed using a screw or buckle fastener provided on tension strap 44. The tension strap 44 provides the connecting means.

Figure 7:
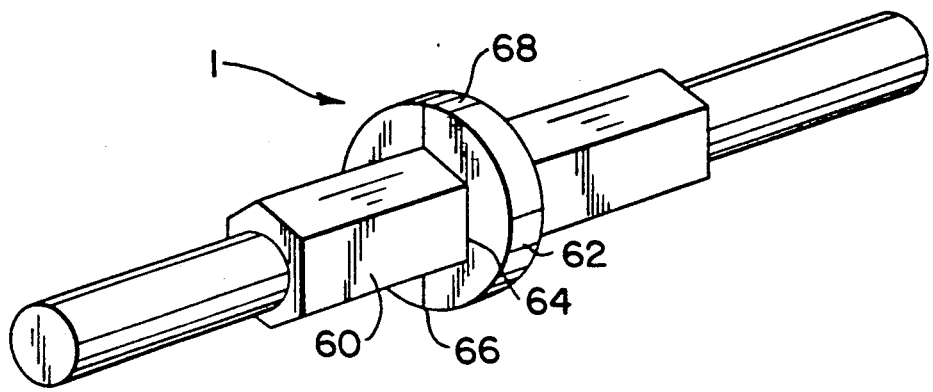
FIG. 7 is a perspective view of the probe according to the third embodiment.
Figure 8:
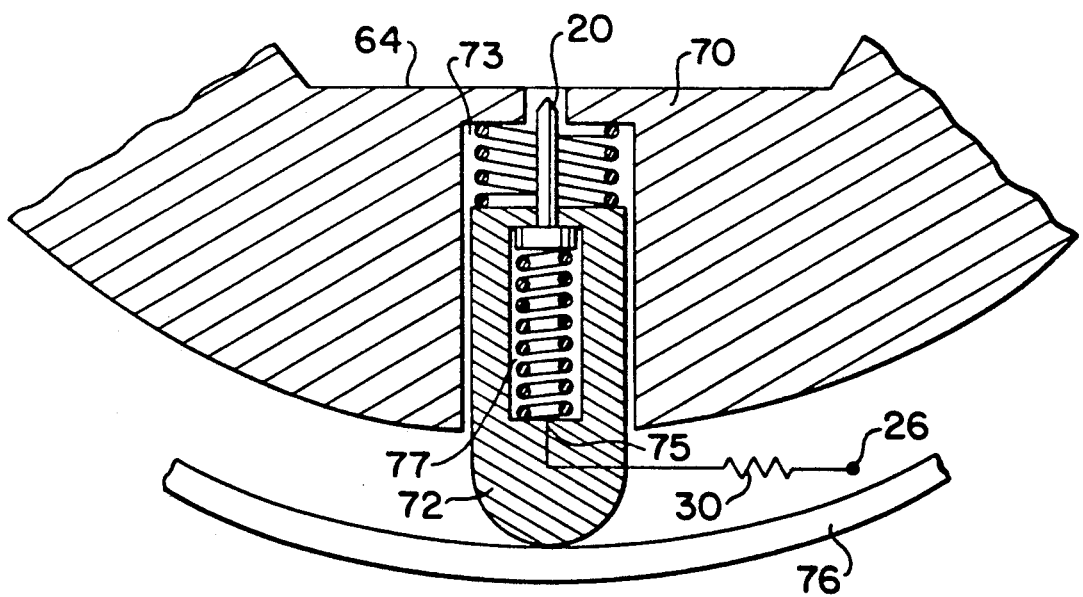
FIG. 8 is an expanded cross-sectional detail of the electrode assembly of the third embodiment.
Figure 9:
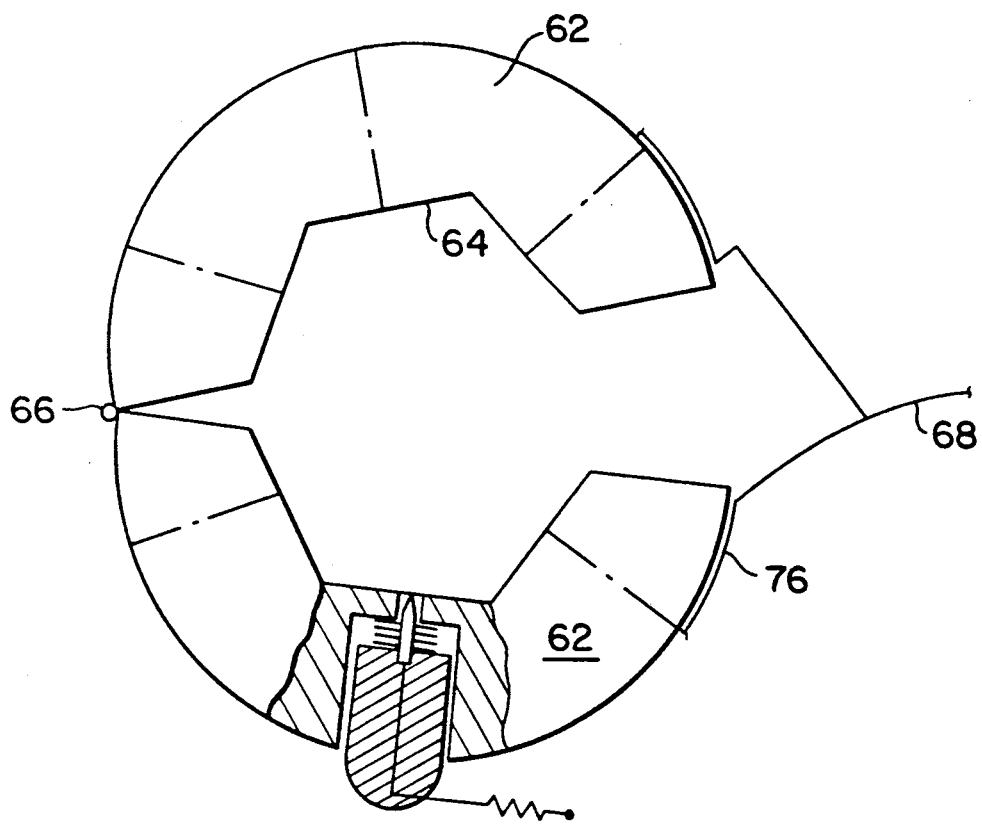
FIG. 9 is an axial end view showing the probe of the third embodiment in the open position.

According to the third preferred embodiment as shown in FIGS. 7, 8 and 9, the probe 1 comprises two semi-annular members 62 connected together at one end of the members 62 by a hinge 66 such that the semi-annular members 62 can open and close on a conductor namely the connector sleeve 60 which has in the third preferred embodiment a hexagonal cross-section. The interior circumference of the members 62 is provided with interior surface segments 64 which form angles of 120° with respect to one another in accordance with the hexagonal cross-section of conductor 60. As best shown in FIG. 8, each surface segment 64 is provided near the center thereof with an electrode 20 which is retractable into the insulating material 70 of the semi-annular members 62. The electrode 20 is maintained in the retracted position below surface 64 by means of a spring 73. The electrode is secured within a member 72 made of an insulating material which is provided to move along the axis of electrode 20 within a cavity provided in the material 70 of semi-annular member 62. The electrode 20 is connected via resistor 30 to a common lead 26.

The probe 1 in the third preferred embodiment may be secured to the hexagonal conductor 60 by closing it on the sleeve and locking the semi-annular member 62 closed together using a simple buckle or locking mechanism 68. The electrodes 20 make contact with the conductor surface by tightening tension strap 76 around the outer circumference of the semi-annular member 62 to apply a pressure onto one extremely of the member 72 which is counteracted at its other extremety by the spring 73. The electrode 20 is mechanically connected to one extremity of a second spring 75 which is disposed in a cavity 77 formed inside the member 72. The second extremety of the second spring 75 is counteracted by the bottom of the cavity 77. The tension strap 76 can be replaced by a cam (not shown); in this case, the second spring 75 is not necessary.

In the third embodiment, the electrodes 20 may alternatively be placed at every second surface segment 64 such that only three electrodes are arranged around the exterior surface of conductor 60.

Also, the electrodes 20 may be arranged in two rows spaced apart longitudinally such that one row is near one side of the surface segments 64 and the other row is near the opposite side, whereby one row can be used for current injection and the other for potential measurement. The two rows provided on one probe 1 work well in the third embodiment since the current and potential electrodes 20 contacting sleeve 60 can be placed relatively close together, which avoids using two probes with a single row.

What is claimed is:

1. A probe for use in non-destructive measuring of electrical resistance of a high current electrical connection between two high current electrical conductors, each of said conductors having a longitudinal exterior surface, the probe comprising:
    an articulated body being articulated about a longitudinal axis;
    a plurality of electrodes provided on an interior portion of the articulated body for engaging about said longitudinal exterior surface;
    connecting means for releasably connecting the articulated body around said longitudinal exterior surface, the connecting means including resilient means cooperating with the plurality of electrodes for causing the electrodes to resiliently engage said surface, the electrodes being located on the probe body to be arranged substantially evenly around and on said longitudinal exterior surface of the corresponding conductor in a plane substantially perpendicular to a current flow in said conductor; and
    resistors connected in series with each said electrode, each of said resistors having substantially an equal resistance substantially greater than a contact resistance between the corresponding electrode and the corresponding conductor, said resistors being connected to at least one common terminal for connection to a high sensitivity low resistance ohm-meter.

2. Probe according to claim 1, wherein the articulated body comprises two opposed substantially rectangular members, each said rectangular member having an interior side facing a corresponding interior side, and two longitudinal and two lateral edges said connecting means including means for connecting the two rectangular members together at one of said two longitudinal edges and allowing for the two rectangular members to move apart and closer together with said faces being substantially parallel, and wherein said electrodes comprise at least four electrodes provided on at least one lateral row on each of said interior sides, whereby said rectangular members can open and close on said longitudinal exterior surface having two major substantially flat sides.

3. Probe according to claim 2, wherein said at least one lateral row comprises first and second series, said first series being located longitudinally adjacent said second series, the electrodes of one of said series being out of line with the electrodes of the other series to allow for a higher density of a large number of electrodes provided along said at least one lateral row.

4. Probe according to claim 2, wherein said resilient means include springs, and each of said springs is disposed in a cavity provided in an interior portion of said two substantially rectangular members for cooperating with the corresponding electrode.

5. Probe according to claim 2, comprising guard means for protecting ends of said electrodes during placement of the probe on said longitudinal exterior surface, said guard means comprising a guide member connected to said body, said guide member being moveable between a projected position for protecting said ends of said electrodes and a retracted position for allowing said electrodes to contact said longitudinal exterior surface.

6. Probe according to claim 5, wherein said guide member is a rectangular frame surrounding said electrodes provided on one of said two rectangular members, and is resiliently connected to said one of said two rectangular members.

7. Probe according to claim 2, wherein said electrodes have a density substantially equal to a density of strands provided on said two major substantially flat sides.

8. Probe according to claim 1, wherein the articulated body comprises two substantially semi-annular members pivotally connected together at one end of said semi-annular members, whereby said semi-annular members can open and close on the corresponding conductor, and wherein said electrodes are provided on an interior portion of both said semi-annular members and are directed radially inward.

9. Probe according to claim 8, wherein at least one of said conductors has a hexagonal cross-section and each said two substantially semi-annular members has an interior surface made of three surface segments, contiguous ones of said three surface segments forming angles of 120°.

10. Probe according to claim 9, wherein one electrode is provided substantially in a center portion of each said surface segment.

11. Probe according to claim 9, wherein one of said electrodes is provided on alternate ones of said surface elements.

12. Probe according to claim 8, wherein a spring is disposed in a cavity provided in an interior portion of said semi-annular members for cooperating with a corresponding electrode and for interconnecting said corresponding electrode with said articulated body, said electrodes being retracted into said semi-annular members by natural action of said springs, and said resilient means cause said electrodes to protrude from said interior portion in resistance to said springs, said resilient means comprising a tension strap surrounding said electrodes, so that said electrodes may be retracted during placement of the probe and caused to protrude to contact said longitudinal exterior surface during use.

13. Probe according to claim 1, wherein the articulated body comprises a plurality of annular segment elements flexibly interconnected, whereby said annular segment elements can open and close on a substantially cylindrical multi-strand conductor cable, each said annular segment elements comprising at least one electrode.

14. Probe according to claim 13, wherein said annular segment elements are flexibly interconnected by at least one open arcuate band to which each said annular segment elements is fixed.

15. Probe according to claim 14, wherein three said arcuate bands are provided, a first of said three arcuate bands having one said annular segment element and being hinged to a second and a third of said three circular bands.

16. Probe according to claim 14, wherein said connecting means comprise an adjustable tension strap to be placed around said circular band.

17. Probe according to claim 15, wherein said connecting means comprise an adjustable tension strap to be placed around said circular band.

18. Probe according to claim 14, wherein each of said electrodes comprises a tungsten wire segment provided on a radially inner surface of said annular segment elements, each of said tungsten wire segments being arranged in said plane substantially perpendicular to a current flow such that a side of said wire segments contact said multi-strand conductor cable.

19. Probe according to claim 18, wherein said tungsten wire segments span substantially two strands of said multi-strand conductor cable.

20. Probe according to claim 2, wherein said at least one lateral row consists of two lateral rows on each said interior sides, said two lateral rows being spaced apart longitudinally, a first one of said lateral rows can be used for current injection and the second one of said lateral rows can be used for potential detection, said second one can be located in a direction of current flowing through said first one of said lateral rows, said electrodes comprising at least eight electrodes.

21. Probe according to claim 20, wherein each of said rows comprises first and second series, said first series being located longitudinally adjacent to said second series, the electrodes of one of said series being out of line with the electrodes of the other series to allow for a higher density of a large number of electrodes along said two lateral rows.

22. Probe according to claim 21, wherein said resilient means include springs, each of said springs is disposed in a cavity provided in an interior portion of said two substantially rectangular members for cooperating with the corresponding electrode.

23. Probe according to claim 21, comprising guard means for protecting ends of said electrodes during placement of the probe on said longitudinal exterior surface, said guard means comprising a guide member connected to said body, said guide member being moveable between a projected position for protecting said ends of said electrodes and a retracted position for allowing said electrodes to contact said longitudinal exterior surface.

24. Probe according to claim 21, wherein said guide member is a rectangular frame surrounding said electrodes provided on one of said two rectangular members, and is resiliently connected to said one of said two rectangular members.

* * * * *